United States Patent
Lv et al.

(10) Patent No.: US 12,028,070 B2
(45) Date of Patent: Jul. 2, 2024

(54) DUTY CYCLE CORRECTION CIRCUIT

(71) Applicant: IPGoal Microelectronics (Sichuan) Co., Ltd., Sichuan (CN)

(72) Inventors: Yalan Lv, Sichuan (CN); Xiangyang Guo, Sichuan (CN); Ranran Feng, Sichuan (CN)

(73) Assignee: IPGOAL MICROELECTRONICS (SICHUAN) CO., LTD., Chengdu (CN)

( * ) Notice: Subject to any disclaimer, the term of this patent is extended or adjusted under 35 U.S.C. 154(b) by 10 days.

(21) Appl. No.: 18/068,070

(22) Filed: Dec. 19, 2022

(65) Prior Publication Data

US 2023/0123349 A1    Apr. 20, 2023

(30) Foreign Application Priority Data

Oct. 25, 2022   (CN) .......................... 202211313401.3

(51) Int. Cl.
*H03K 3/017* (2006.01)
(52) U.S. Cl.
CPC ..................... *H03K 3/017* (2013.01)
(58) Field of Classification Search
CPC ........ H03K 3/017; H03K 5/04; H03K 5/1565; H03K 7/08
See application file for complete search history.

(56) References Cited

U.S. PATENT DOCUMENTS

| | | |
|---|---|---|
| 6,686,862 B1 | 2/2004 | Tagare |
| 9,780,662 B1 * | 10/2017 | Milanesi ............... H02M 3/156 |
| 2007/0040537 A1 * | 2/2007 | Low ..................... H02M 3/1588 323/282 |
| 2007/0090866 A1 | 4/2007 | Park et al. |
| 2012/0014699 A1 * | 1/2012 | Curt ..................... H04B 10/079 398/208 |
| 2012/0293225 A1 | 11/2012 | Shin |
| 2017/0373597 A1 * | 12/2017 | Kato ....................... H02M 1/32 |
| 2020/0321946 A1 | 10/2020 | Colles et al. |

FOREIGN PATENT DOCUMENTS

| | | |
|---|---|---|
| CN | 110266294 A | 9/2019 |
| JP | H03-024723 A1 | 3/1991 |

* cited by examiner

*Primary Examiner* — Sibin Chen

(74) *Attorney, Agent, or Firm* — SHIMOKAJI IP

(57) ABSTRACT

A duty cycle correction circuit includes a sawtooth wave generating unit, a voltage regulating unit, a differential comparator, a differential amplifier and low-pass filters. The sawtooth wave generating unit converts a narrow pulse signal into a sawtooth wave signal with a duty cycle of 50% which is input into the differential comparator. The voltage regulating unit regulates an input voltage value of a non-inverting input terminal of the differential comparator. The differential comparator compares a voltage difference between input signals of input terminals and outputs an output clock signal. The low-pass filters input DC components to the differential amplifier which amplifies the DC signals and output to the voltage regulating unit. The duty cycle correction circuit has a small chip occupying area to realize high integration of the chip, and the duty cycle of the output clock is accurately corrected to ensure the stability of the output clock frequency.

9 Claims, 1 Drawing Sheet

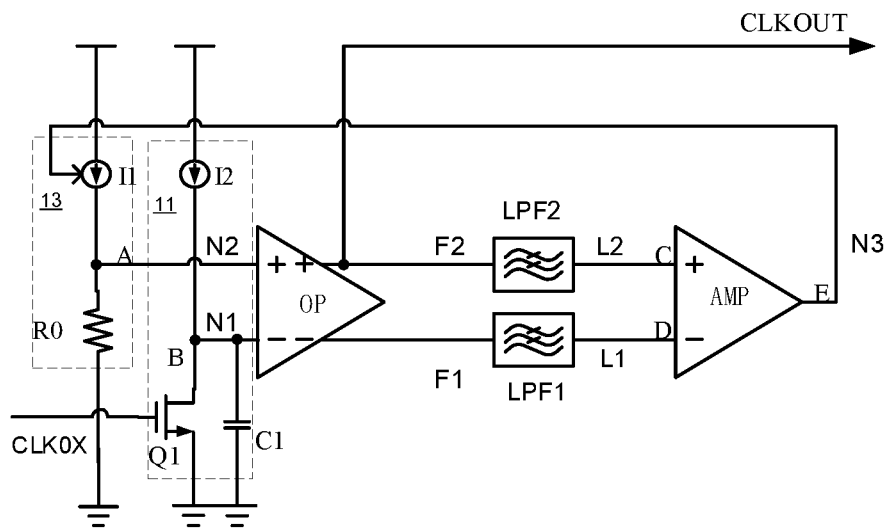

DUTY CYCLE CORRECTION CIRCUIT

FIELD OF THE INVENTION

The application relates to the field of integrated circuits, in particular to a duty cycle correction circuit.

BACKGROUND OF THE INVENTION

In high-speed large-scale integrated circuits, the quality of clock signal is demanding. In addition to the common clock jitter, the clock duty cycle is becoming a key factor affecting the performance of high-speed integrated circuits. It's particularly important for the clock signal with duty cycle of 50% in high-speed large-scale integrated circuits. For example, in memory, the utilization efficiency of the level of the clock can be maximized at a duty cycle of 50%, so as to ensure the normal operation of the system and the optimal performance.

Conventional frequency doubling circuits are usually implemented in the form of phase locked loop (PLL). The PLL is composed of a phase detector (PD), a low pass filter (LPF), a voltage controlled oscillator (VCO) and a frequency divider (N). The basic configuration of a PLL is to compare the phase of a reference signal with the phase of an adjustable feedback signal. At the center of this circuit is a phase detector. If there is a phase difference between the two signals, a phase error signal will be generated and output. By using this error signal, the oscillation frequency of VCO can be controlled, so that the phase of VCO can be consistent with the phase of the reference signal (namely the frequency), so as to achieve the purpose of frequency doubling.

However, the duty cycle of the clock is not corrected in the conventional frequency doubling realization, thus the precision of frequency doubling cannot be guaranteed, even sometimes it may not be able to realize frequency doubling normally, which affects the normal operation of the whole frequency doubling circuit.

Therefore, it is necessary to provide an improved duty cycle correction circuit to overcome the above defects, so as to further improve the efficiency of the frequency doubling circuit.

SUMMARY OF THE INVENTION

The purpose of the present application is to provide a duty cycle correction circuit. The duty cycle correction circuit of the application has a small chip occupying area to realize high integration of the chip. The duty cycle of the output clock is accurately corrected to ensure the stability of the output clock frequency.

To achieve the above purpose, a duty cycle correction circuit of the present application includes a sawtooth wave generating unit, a voltage regulating unit, a differential comparator, a differential amplifier and two low-pass filters. The sawtooth wave generating unit is configured to convert a narrow pulse signal that is input into a sawtooth wave signal with a duty cycle of 50%, and input the sawtooth wave signal into an inverting input terminal of the differential comparator; the voltage regulating unit is connected with an output terminal of the differential amplifier and configured to regulate a voltage value of an input signal of a non-inverting input terminal of the differential comparator based on a voltage value of an output signal of the differential amplifier; the differential comparator is configured to compare a voltage difference between input signals of two input terminals and output a differential comparison result, and output an output clock signal at the non-inverting output terminal; the two low-pass filters are configured to carry out low-pass filtering on the differential comparison result, and input a DC component obtained after filtering respectively to two input terminals of the differential amplifier, and the differential amplifier is configured to differentially amplify two input DC signals and then output to the voltage regulating unit.

As a preferable embodiment, the voltage regulating unit includes a resistor and a first current source, one end of the resistance is grounded, the other end of the resistance is connected with the non-inverting input terminal of the differential comparator, one end of the first current source is connected with an external power supply, and the other end of the first current source is connected with the non-inverting input terminal of the differential comparator.

As a preferable embodiment, the first current source is a voltage controlled current source, and a control terminal of the first current source is connected with the output terminal of the differential comparator; a current output from the first current source is decreased when a voltage of an output signal of the differential comparator is increased; and the current output from the first current source is increased when the voltage of the output signal of the differential comparator is decreased.

As a preferable embodiment, the sawtooth wave generating unit includes a field effect transistor, a second current source and a capacitor, an external narrow pulse signal is input into a gate of the field effect transistor, a source of the field effect transistor is grounded, and a drain of the field effect transistor is connected with an inverting input terminal of the differential comparator; one end of the second current source is connected with the external power supply, and the other end of the second current source is connected with the inverting input terminal of the difference comparator; one end of the capacitor is grounded, and the other end of the capacitor is connected to the inverting input terminal of the differential comparator.

As a preferable embodiment, an output signal of the differential amplifier is a signal containing duty cycle offset.

As a preferable embodiment, if an input voltage of the non-inverting input terminal of the differential comparator is lower than an average voltage of the sawtooth wave signal of the inverting input terminal of the differential comparator, the differential amplifier is configured to increase the output current of the first current source; or if an input voltage of the non-inverting input terminal of the differential comparator is larger than an average voltage of the sawtooth wave signal of the inverting input terminal of the differential comparator, the differential amplifier is configured to decrease the output current of the first current source.

As a preferable embodiment, the field effect transistor is turned on when a narrow pulse arrives, and is turned off when the narrow pulse disappears.

As a preferable embodiment, when the narrow pulse arrives, the field effect transistor is turned on and immediately outputs a low level to the inverting input terminal of the differential comparator; when the narrow pulse disappears, the second current source charges the drain of the field effect transistor to raise a level of the inverting input terminal of the differential comparator, and the level immediately goes to the low level once a next narrow pulse arrives.

As a preferable embodiment, when the narrow pulse disappears, the second current source charges the capacitor to raise the low level of the inverting input terminal of the differential comparator to a high level at a constant rate, and the level immediately goes to the low level once a next narrow pulse arrives.

In comparison with the prior arts, in the duty cycle correction circuit of the application, the differential amplifier circularly amplifies an average voltage difference between the two differential input signals of the differential comparator, and controls the voltage of another input signal at the other input terminal of the differential amplifier. The duty cycle of the sawtooth wave signal generated by the sawtooth wave generating unit is 50%. The differential comparator compares the signal with a reference signal (sawtooth wave signal), meanwhile, the voltage regulating unit regulates the voltage of the signal based on the voltage of the output signal of the differential amplifier, in such a way, after the circular adjustments of the voltage regulating unit and the circular comparisons of the differential comparator, the duty cycle of the output clock CLKOUT output by the differential comparator can be stabilized at 50%, thereby realizing the correction of the duty cycle of the output clock.

The application will become clearer by the following description in conjunction with drawings which are used to explain embodiments of the application.

BRIEF DESCRIPTION OF THE DRAWINGS

The accompanying drawings facilitate an understanding of the various embodiments of this application. In such drawings:

FIG. 1 is a schematic diagram of the duty cycle correction circuit according to an embodiment of the present application.

DETAILED DESCRIPTION OF ILLUSTRATED EMBODIMENTS

In order to make the purpose, technical solutions and advantages of the present application more clearly understood, the present application will be described in further detail below with reference to the accompanying drawings and embodiments. It should be understood that the specific embodiments described herein are only used to explain the present application, but not to limit the present application. The same reference numbers in different FIGURES represent the same parts. The present application is aimed at providing a duty cycle correction circuit, which has a small chip occupying area to realize the high integration of the chip; and the duty cycle of the output clock is accurately corrected to ensure the stability of the output clock frequency.

Referring to FIG. 1, a schematic diagram of the duty cycle correction circuit according to an embodiment of the present application is shown. As illustrated, the duty cycle correction circuit includes a sawtooth wave generating unit 11, a voltage regulating unit 13, a differential comparator OP, a differential amplifier AMP and two low-pass filters LPF1 and LPF2. The sawtooth wave generating unit 11 is configured to convert a narrow pulse signal CLK0X that is input into a sawtooth wave signal N1 with a duty cycle of 50%, and input the sawtooth wave signal N1 into an inverting input of the differential comparator OP. The voltage regulating unit 13 is connected with an output terminal of the differential amplifier AMP and configured to regulate a voltage value of an input signal of a non-inverting input terminal of the differential comparator OP based on a voltage value of an output signal N3 of the differential amplifier AMP. The differential comparator OP is configured to compare a voltage difference (a voltage of input signal N1 means an average voltage) between two input signals (N1 and N2) of two input terminals and output a differential comparison result (such as F1 and F2), and output an output clock signal CLKOUT from a non-inverting output terminal. The two low-pass filters LPF1 and LPF2 are configured to carry out low-pass filtering on the differential comparison result (F1 and F2), and input DC components (L1, L2) obtained after filtering respectively to two input terminals of the differential amplifier AMP, and the differential amplifier AMP is configured to differentially amplify two input DC signals (L1, L2) to generate an output signal N3, and then output the output signal N3 to the voltage regulating unit 13.

In the duty cycle correction circuit of the invention, the output signal N3 of the differential amplifier AMP is circularly input to the control terminal of the first current source I1, the output current of the first current source I1 is controlled, and the voltage value of the signal N2 at the non-inverting input terminal of the differential comparator OP is adjusted, in such a way, the duty cycle of the output clock CLKOUT at the non-inverting output terminal of the differential comparator OP is adjusted on the base of the corresponding relationship between DC voltage and duty cycle, thereby correcting the duty cycle of the output clock CLKOUT.

Specifically, in the present application, the voltage regulating unit 13 includes a resistor R0 and a first current source I1, one end of the resistance R0 is grounded, the other end of the resistance R0 is connected with the non-inverting input terminal of the differential comparator OP, one end of the first current source I1 is connected with an external power supply, and the other end of the first current source I1 is connected with the non-inverting input terminal of the differential comparator OP. The first current source I1 is a voltage controlled current source, and a control terminal of the first current source I1 is connected with the output terminal of the differential amplifier AMP. When the voltage of the output signal N3 of the differential amplifier AMP is increased, the current output from the first current source I1 is decreased, thus the voltage drop at both ends of the resistor R0 is reduced, and the voltage VA at node A is reduced, that is, the voltage of the input signal N2 at the non-inverting input terminal of the differential comparator OP is reduced. When the voltage of the output signal N3 of the differential amplifier AMP is decreased, the current output from the first current source I1 is increased, thus the voltage drop at both ends of the resistor R0 is increased, and the voltage VA at node A is increased, that is, the voltage of the input signal N2 at the non-inverting input terminal of the differential comparator OP is increased. In such a way, the voltage regulating unit 13 may adjust the voltage value of non-inverting input signal N2 of the differential comparator OP based on the voltage value of the output signal N3 of the differential amplifier AMP, thereby adjusting the duty cycle of the output clock CLKOUT.

Further, in the embodiments, the sawtooth wave generating unit 11 includes a field effect transistor Q1, a second current source I2 and a capacitor C1. An external narrow pulse signal CLK0X is input into a gate of the field effect transistor Q1, a source of the field effect transistor Q1 is grounded, and a drain of the field effect transistor Q1 is connected with the inverting input terminal of the differential comparator OP. One end of the second current source I2 is connected with an external power supply, and the other end of the second current source I2 is connected with the inverting input terminal of the difference comparator OP. One end of the capacitor C1 is grounded, and the other end of the capacitor C1 is connected to the inverting input terminal of the differential comparator OP. Preferably, the field effect transistor Q1 is turned on when a narrow pulse arrives, and is turned off when the narrow pulse disappears. The narrow pulse signal CLK0X may be the pulse signal generated by the external circuit, such a pulse signal is required to energize and switch on the field effect transistor Q1.

Specifically, the process of the sawtooth wave generating unit 11 converting a narrow pulse signal CLK0X into a sawtooth wave signal N1 is as follows. Once the narrow pulse arrives, the field effect transistor Q1 is turned on and immediately outputs a low level to the inverting input terminal of the differential comparator OP, thus the voltage at node B is immediately reduced. Once the narrow pulse disappears, the second current source I2 charges the drain of the field effect transistor Q1 to raise the level of the inverting input terminal of the differential comparator OP, that is, the voltage at the node B is increased, and the level immediately goes to the low level once a next narrow pulse arrives. Repeat in this way, a sawtooth wave signal N1 is generated and then input into the inverting input terminal of the differential comparator OP. Preferably, once the narrow pulse disappears, the second current source I2 charges the capacitor C1 to raise the low level of the inverting input terminal (namely node B) of the differential comparator OP to the high level at a constant rate, and the high level will be immediately reduced to be the low level once a next narrow pulse arrives, thereby ensuring the duty cycle of the sawtooth wave signal N1 to be 50%.

As a preferable embodiment, the output signal N3 of the differential amplifier AMP is a signal containing duty cycle offset. Specifically, the output signal N3 is generated as follows. Firstly, the differential comparator OP proceeds with the comparisons. If an input voltage of the non-inverting input terminal of the differential comparator OP is lower than an average voltage of the sawtooth wave signal N1 of the inverting input terminal of the differential comparator OP, the output signal N3 from the differential amplifier AMP controls to increase the output current of the first current source I1. If an input voltage of the non-inverting input terminal of the differential comparator OP is larger than an average voltage of the sawtooth wave signal N1 of the inverting input terminal of the differential comparator OP, the output signal N3 from the differential amplifier AMP controls to decrease the output current of the first current source I1. That is to say, the output signal (F2 and F1) after the differential comparison is obtained by comparing the sawtooth signal N1 (its duty cycle is 50%) with another input signal N2 (its duty cycle is not 50%), the output signal (F2 and F1) is differentially amplified by the differential amplifier AMP and then output to generate the output signal N3. At this time, the output signal N3 contains the duty cycle offset between the sawtooth signal N1 and the input signal N2. Understandably, the output signal (N3) containing the duty cycle offset is generated after continuous comparisons and adjustment of an uncertain signal (N2) during the operation realization of the duty cycle correction circuit of the invention. Before the duty cycle of the output clock CLKOUT is corrected to be 50%, the signal N2 is constantly changed in real time and finally becomes stable as the stability of CLKOUT duty cycle of output clock.

Referring to FIG. 1a again, the process of the duty cycle correction for the output clock CLKOUTR according to the circuit of the present application follows.

Given that the duty cycle of the signal F2 (the input of low-pass filter LPF1) is relative large, and the duty cycle of the signal F1 (the input of low-pass filter LPF2) is relative small. The signals F2 and signal F1 respectively pass through the low-pass filter LPF1 and low-pass filter LPF2 to generate DC components L2 and L1. The voltage of the DC component L2 is VC (the voltage of node C) and the voltage of DC component L1 is VD (the voltage of node D). According to the filtering theory, the DC voltage is higher if the duty cycle is larger; whereas, the DC voltage is lower if the duty cycle is smaller. In the invention, the difference between the voltage VC and the voltage VD is amplified to obtain a voltage VE at node E. Such a voltage VE is larger if the duty cycle is larger. As known, the current output of the first current source I1 is controlled by the voltage VE, that is, the current output from the first current source I1 becomes smaller if the voltage VE becomes larger. That is, the current flowing through the resistor R0 becomes smaller when the voltage VE becomes larger. Further, the voltage VA at node A is: VA=I1*R0, thus the voltage VA at node A becomes smaller as the resistor R0 becomes smaller, where VA is the voltage value of the signal N2. Then the voltage VA is compared with the voltage that can represent the sawtooth signal N1 with duty cycle of 50%. As shown in FIG. 1, node A is the non-inverting input terminal of the differential comparator OP, and the positive phase output of the differential comparator OP is the input of the low-pass filter LPF1. When the voltage VA of node A is reduced due to the large duty cycle of signal F2, the duty cycle of the positive phase output signal F2 (the input signal of the low-pass filter LPF1) of the differential comparator OP is reduced accordingly. In other words, the duty cycle of the output clock CLKOUT is reduced, thereby adjusting the duty cycle of the output clock CLKOUT.

On the contrary, given that the duty cycle of the signal F2 (the input of low-pass filter LPF1) is relative small, and the duty cycle of the signal F1 (the input of low-pass filter LPF2) is relative large. The signals F2 and signal F1 respectively pass through the low-pass filter LPF1 and low-pass filter LPF2 to generate DC components L2 and L1. The voltage of the DC component L2 is VC (the voltage of node C) and the voltage of DC component L1 is VD (the voltage of node D). According to the filtering theory, the DC voltage is higher if the duty cycle is larger; whereas, the DC voltage is lower if the duty cycle is smaller. In the invention, the difference between the voltage VC and the voltage VD is amplified to obtain a voltage VE at node E. Such a voltage VE is smaller if the duty cycle is smaller. As known, the current output of the first current source I1 is controlled by the voltage VE, that is, the current output from the first current source I1 becomes larger if the voltage VE becomes smaller. That is, the current flowing through the resistor R0 becomes larger when the voltage VE becomes smaller. Further, the voltage VA at node A is: VA=I1*R0, thus the voltage VA at node A becomes larger as the resistor R0 becomes lager, where VA is the voltage value of the signal N2. Then the voltage VA is compared with the voltage that can represent the sawtooth signal N1 with duty cycle of 50%. As shown in FIG. 1, node A is the non-inverting input of the differential comparator OP, and the non-inverting output of the differential comparator OP is the input of the low-pass filter LPF1. When the voltage VA of node A is increased due to the small duty cycle of signal F2, the duty cycle of the non-inverting output signal F2 (the input signal of the low-pass filter LPF1) of the differential comparator OP is increased accordingly. In other words, the duty cycle of the output clock CLKOUT is increased, thereby adjusting the duty cycle of the output clock CLKOUT.

In this way, no matter whether the duty cycle of signal F2 is larger or smaller than that of signal F1 at the beginning, after the circular adjustments and corrections in the above adjustment process, the duty cycle of the final signal F2 is continually close to the signal F1 until the same duty cycle of 50% as that of signal F1 is reached, that is, the duty cycle of the output clock CLKOUT is adjusted and corrected to be 50%.

To sum up, in the duty cycle correction circuit of the application, the differential amplifier AMP amplifies the voltage difference between the two differential input signals (N1 and N2) of the differential comparator OP, and controls the voltage of the input signal N2 at the other input terminal of the differential amplifier OP. The duty cycle of the sawtooth wave signal N1 generated by the sawtooth wave generating unit 11 is 50%. The differential comparator OP compares the signal N2 with the reference signal (sawtooth wave signal) N1, at the same time, the voltage regulating unit 13 regulates the voltage of the signal N2 based on the voltage of the output signal N3 of the differential amplifier AMP, in such a way, after the circular adjustments of the voltage regulating unit 13 and the circular comparisons of the differential comparator AMP, the duty cycle of the output clock CLKOUT output by the differential comparator OP can be stabilized at 50%, thereby realizing the correction of the duty cycle of the output clock CLKOUT.

The above-mentioned embodiments only represent several embodiments of the present application, and the descriptions thereof are relatively specific and detailed, but should not be construed as limiting the scope of the patent application. It should be pointed out that for those skilled in the art, several modifications and improvements can be made without departing from the concept of the present application, which all belong to the protection scope of the present application. Therefore, the scope of protection of the patent of the present application shall be subject to the appended claims.

What is claimed is:

1. A duty cycle correction circuit, comprising a sawtooth wave generating unit, a voltage regulating unit, a differential comparator, a differential amplifier and two low-pass filters,
   wherein the sawtooth wave generating unit is configured to convert a narrow pulse signal that is input into a sawtooth wave signal with a duty cycle of 50%, and input the sawtooth wave signal into an inverting input terminal of the differential comparator;
   the voltage regulating unit is connected with an output terminal of the differential amplifier and configured to regulate a voltage value of an input signal of a non-inverting input terminal of the differential comparator based on a voltage value of an output signal of the differential amplifier;
   the differential comparator is configured to compare a voltage difference between input signals of the inventing and non-inverting input terminals and output a differential comparison result, and output an output clock signal at the non-inverting output terminal;
   the two low-pass filters are configured to carry out low-pass filtering on the differential comparison result to output two DC components, and the two DC components obtained after filtering are respectively input to two input terminals of the differential amplifier, and the differential amplifier is configured to differentially amplify the two DC components and then output to the voltage regulating unit.

2. The duty cycle correction circuit according to claim 1, wherein the voltage regulating unit comprises a resistor and a first current source, one end of the resistance is grounded, the other end of the resistance is connected with the non-inverting input terminal of the differential comparator, one end of the first current source is connected with an external power supply, and the other end of the first current source is connected with the non-inverting input terminal of the differential comparator.

3. The duty cycle correction circuit according to claim 2, wherein the first current source is a voltage controlled current source, and a control terminal of the first current source is connected with the output terminal of the differential amplifier; a current output from the first current source is decreased when a voltage of an output signal of the differential amplifier is increased; and the current output from the first current source is increased when the voltage of the output signal of the differential amplifier is decreased.

4. The duty cycle correction circuit according to claim 3, wherein an output signal of the differential amplifier is a signal containing duty cycle offset.

5. The duty cycle correction circuit according to claim 4, wherein if an input voltage of the non-inverting input terminal of the differential comparator is lower than an average voltage of the sawtooth wave signal of the inverting input terminal of the differential comparator, the differential amplifier is configured to increase the output current of the first current source; or if an input voltage of the non-inverting input terminal of the differential comparator is larger than an average voltage of the sawtooth wave signal of the inverting input terminal of the differential comparator, the differential amplifier is configured to decrease the output current of the first current source.

6. The duty cycle correction circuit according to claim 2, wherein the sawtooth wave generating unit comprises a field effect transistor, a second current source and a capacitor, an external narrow pulse signal is input into a gate of the field effect transistor, a source of the field effect transistor is grounded, and a drain of the field effect transistor is connected with the inverting input terminal of the differential comparator; one end of the second current source is connected with the external power supply, and the other end of the second current source is connected with the inverting input terminal of the difference comparator; one end of the capacitor is grounded, and the other end of the capacitor is connected to the inverting input terminal of the differential comparator.

7. The duty cycle correction circuit according to claim 6, wherein the field effect transistor is turned on when a narrow pulse arrives, and is turned off when the narrow pulse disappears.

8. The duty cycle correction circuit according to claim 7, wherein when the narrow pulse arrives, the field effect transistor is turned on and immediately outputs a low level to the inverting input terminal of the differential comparator; when the narrow pulse disappears, the second current source charges the drain of the field effect transistor to raise a level of the inverting input terminal of the differential comparator, and the level immediately goes to the low level once a next narrow pulse arrives.

9. The duty cycle correction circuit according to claim 8, wherein when the narrow pulse disappears, the second current source charges the capacitor to raise the low level of the inverting input terminal of the differential comparator to a high level at a constant rate, and the level immediately goes to the low level once a next narrow pulse arrives.

* * * * *